c
(12) United States Patent
Brodsky et al.

(10) Patent No.: US 10,028,419 B2
(45) Date of Patent: Jul. 17, 2018

(54) ELECTROMAGNETIC GASKETS FOR A CABLE CONNECTION

(71) Applicant: International Business Machines Corporation, Armonk, NY (US)

(72) Inventors: William L. Brodsky, Binghamton, NY (US); Robert R. Genest, Poughkeepsie, NY (US); John J. Loparco, Poughkeepsie, NY (US); Michael T. Peets, Staatsburg, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/424,924

(22) Filed: Feb. 6, 2017

(65) Prior Publication Data
US 2017/0150656 A1 May 25, 2017

Related U.S. Application Data

(63) Continuation of application No. 14/687,947, filed on Apr. 16, 2015, now Pat. No. 9,615,492.

(51) Int. Cl.
*H05K 9/00* (2006.01)
*H01R 13/6584* (2011.01)
*H01R 13/6592* (2011.01)
*H01R 13/74* (2006.01)

(52) U.S. Cl.
CPC ....... *H05K 9/0016* (2013.01); *H01R 13/6584* (2013.01); *H01R 13/6592* (2013.01); *H01R 13/74* (2013.01)

(58) Field of Classification Search
CPC . H05K 9/0009; H05K 9/0016; H01R 13/6584
See application file for complete search history.

(56) References Cited

U.S. PATENT DOCUMENTS

| | | |
|---|---|---|
| 6,878,872 B2 | 4/2005 | Lloyd et al. |
| 6,884,937 B1 | 4/2005 | Mistry et al. |
| 6,997,722 B2 | 2/2006 | Mangold |
| 7,001,217 B2 | 2/2006 | Bright et al. |
| 7,168,971 B2 | 1/2007 | Manson et al. |

(Continued)

OTHER PUBLICATIONS

IBM: List of IBM Patents or Patent Applications Treated As Related (Appendix P), Dated Feb. 6, 2017, 2 pages.

*Primary Examiner* — Hung V Ngo
(74) *Attorney, Agent, or Firm* — Michael O'Keefe

(57) ABSTRACT

A gasket assembly structure including a frame which includes a front half and a back half joined together with a plurality of interlocking tabs located around a perimeter of the frame, defining a window, and an electromagnetic gasket, constrained between the front half and the back half of the frame; where the electromagnetic gasket lines an interior perimeter of the window and partially extends from the frame into the window, and a passageway through the window of the frame with boarders defined by the constrained electromagnetic gasket. A housing structure including a receptacle recessed within an opening on a front side of the housing, the receptacle is rigidly attached to the housing, and a gasket assembly recessed within the opening and located between the front side of the housing and the receptacle, where the gasket assembly is directly secured to the housing.

12 Claims, 5 Drawing Sheets

(56) References Cited

U.S. PATENT DOCUMENTS

| | | | |
|---|---|---|---|
| 7,322,854 | B2 | 1/2008 | Long et al. |
| 7,438,596 | B2 | 10/2008 | Phillips |
| 7,473,131 | B2 | 1/2009 | Dunwoody et al. |
| 7,473,139 | B2 | 1/2009 | Barringer et al. |
| 7,727,018 | B2 | 6/2010 | Bright et al. |
| 8,162,675 | B2 | 4/2012 | Regnier et al. |
| 8,203,084 | B2 | 6/2012 | Wertz, Jr. et al. |
| 8,890,004 | B2 * | 11/2014 | Wickes ............... H05K 9/0009 174/354 |
| 2007/0114060 | A1 | 5/2007 | Barringer et al. |
| 2010/0151733 | A1 | 6/2010 | Tsou |
| 2010/0266246 | A1 | 10/2010 | van Haaster |
| 2013/0072063 | A1 | 3/2013 | Qiao |
| 2016/0309625 | A1 | 10/2016 | Brodsky et al. |

* cited by examiner

ELECTROMAGNETIC GASKETS FOR A CABLE CONNECTION

BACKGROUND

The present invention generally relates to electronic cable connections for electronic transmission. More specifically, the present invention relates to electromagnetic cable gaskets.

Cables and cable connections need to be electromagnetic compliant, such that electronic emission of the cable and the cable connection is minimized and does not generate electromagnetic disturbances to other electronic components. Gaskets placed at cable connections help to minimize electromagnetic disturbances and reduce both the emission of electromagnetic disturbances from the cable and the introduction of external electromagnetic disturbances into the cable.

SUMMARY

According to one embodiment of the present invention, a gasket assembly structure is provided. The gasket assembly structure may include a frame including a front half and a back half joined together with a plurality of interlocking tabs located around a perimeter of the frame, defining a window, and an electromagnetic gasket, constrained between the front half and the back half of the frame; where the electromagnetic gasket lines an interior perimeter of the window and partially extends from the frame into the window, and a passageway through the window of the frame with boarders defined by the constrained electromagnetic gasket.

According to another embodiment, a housing structure is provided. The housing structure may include a receptacle recessed within an opening on a front side of the housing, the receptacle is rigidly attached to the housing, and a gasket assembly recessed within the opening and located between the front side of the housing and the receptacle, where the gasket assembly is directly secured to the housing and comprises a passageway defined by an electromagnetic gasket constrained between a front half and a back half of a frame.

According to another embodiment, a housing structure is provided. The structure may include a receptacle recessed within an opening on a front side of the housing, the receptacle is rigidly attached to the housing, and a gasket assembly recessed within the opening and located between the front of the housing and the receptacle, the gasket assembly is directly secured to the housing and comprises a passageway defined by an electromagnetic gasket constrained between a front half and a back half of a frame, where the receptacle receives a cable assembly to form a cable connection between the cable assembly and the housing, and the passageway is sized and dimensioned to receive a connector body of a cable assembly such that the connector body is in direct contact with the electromagnetic gasket.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

Figure 1:
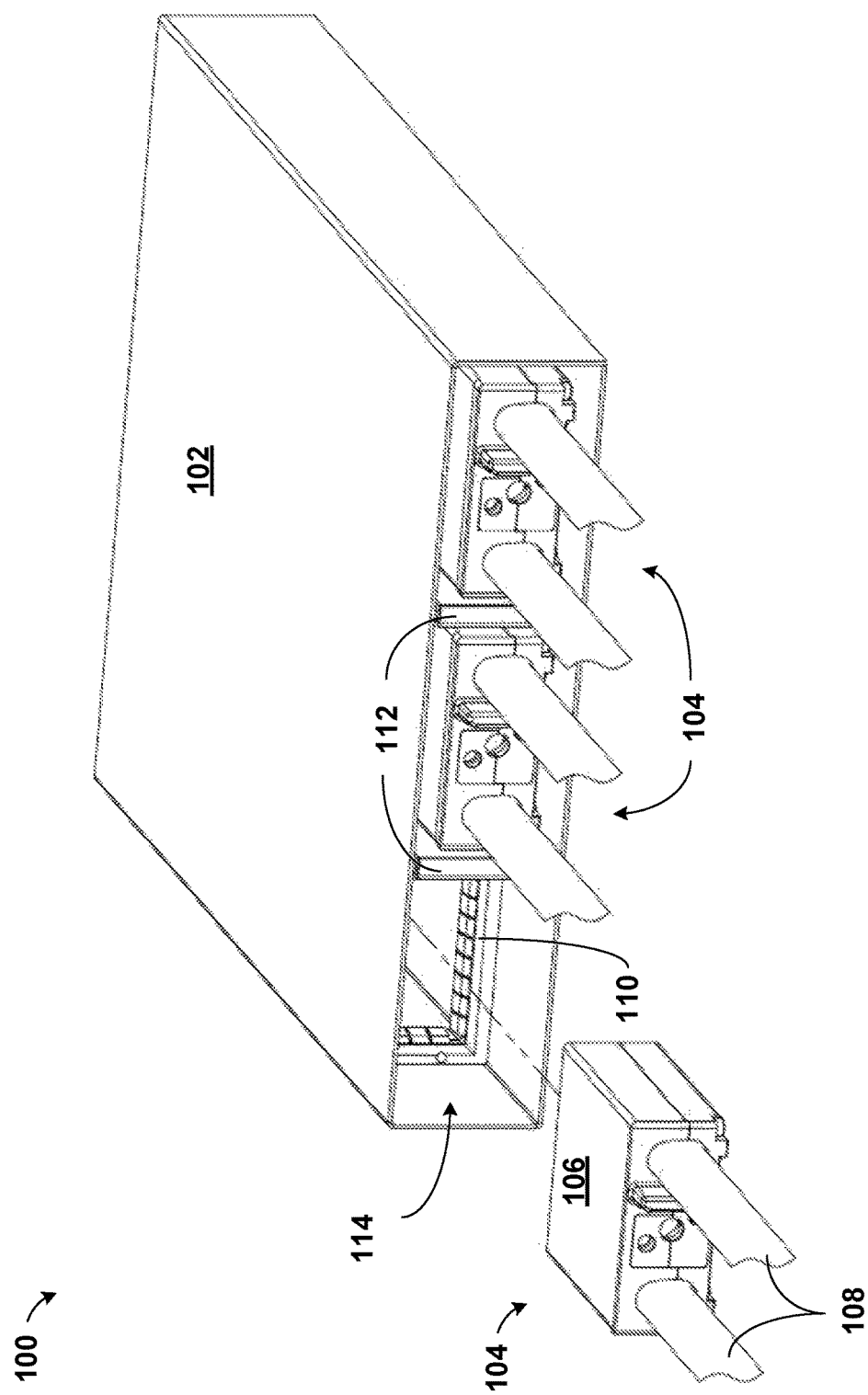
FIG. 1 is an isometric view of a first assembly according to an exemplary embodiment.

Elements of the figures are not necessarily to scale and are not intended to portray specific parameters of the invention. For clarity and ease of illustration, scale of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Electromagnetic interference (or EMI) or disturbance occurs when the performance of electronic equipment is degraded due to the electromagnetic radiation emissions from an external source. Electronic equipment should be designed to minimize both electromagnetic radiation emission and any electromagnetic interference introduced into the electronic equipment from an external source. EMI may also occur as the result of static electricity, or the imbalance of electrical charges on the surface or within a material. A static electric charge may occur when two different materials touch and separate. Electromagnetic shielding to isolate electronic devices and cables can help reduce EMI. An example of electromagnetic shielding is barriers, for example a gasket at a cable connection.

An electronic device which is electromagnetic compliant (EMC) minimizes the generation of electromagnetic disturbances which may influence other electronic devices. One method of controlling the EMC of an electronic device is by using electromagnetic gaskets at the cable connections.

The present invention generally relates to electronic cable connections for electronic transmission. More specifically, the present invention relates to electromagnetic cable gaskets. One way to control electromagnetic disturbances between electronic components may include using a robust electromagnetic gasket located within a receptacle housing of a cable connection. One embodiment by which to control electromagnetic disturbances between electronic components is described in detail below by referring to the accompanying drawings in FIGS. 1 to 5, in accordance with an illustrative embodiment.

Referring now to FIG. 1, an isometric view of a first assembly 100 is shown in accordance with an embodiment of the present invention. The first assembly 100 may include a receptacle housing 102 and a cable assembly 104, according to an exemplary embodiment. The cable assembly 104 may include any cable assembly known in the art, such as, for example, a single-conductor cable, a multi-conductor cable, or a fiber optic cable. The cable assembly 104 may include a connector body 106 and one or more wire bundles 108 terminated within and extending from a back end of the connector body 106. In general, a front end of the connector body 106 may be rectangular in shape; however it may be any shape or size suitable for the number of wires or number of wire bundles 108. For example, the front end of the connector body 106 may alternatively be circular, triangular, trapezoidal, or square in shape. The connector body 106 may generally be made of a metal or a conductive plastic.

The receptacle housing 102 may be any component designed with a receptacle (not shown) for receiving the cable assembly 104 to form a cable connection. The cable connection formed between the cable assembly 104 and the receptacle housing 102 may be used for either power transmission, signal transmission, or both. In an embodiment, the receptacle housing 102 may be a primary interface for all cable connections to and from a server, or a mainframe as a standalone component or an integrated component. The receptacle housing 102 may be made from any suitable material known in the art. Suitable materials may be those which offer structural integrity to physically support the requisite cable connections along with conductive properties used as part of an EMC shielding solution.

Most typically, the receptacle housing 102 may include an opening 114 in which the receptacle may be positioned at or near a bottom or back of the opening 114. When forming the cable connection between the cable assembly 104 and the receptacle housing 102, the cable assembly 104 may be inserted into the opening 114 upon which it engages with the receptacle to complete the cable connection.

In the present example, the receptacle housing 102 may include multiple openings 114, each designed to receive a single cable assembly 104 to form a single cable connection. The multiple openings 114 may be separated by a divider 112 which may provide gross alignment when inserting the cable assembly 104 into the receptacle housing 102. The receptacle housing 102 may further include a gasket assembly 110 which may be used to minimize static electricity and EMI and prevent damage to other electronic devices. The gasket assembly 110 is described in detail below with reference to FIGS. 3 and 4. The gasket assembly 110 may be secured within the opening 114 and form or provide a passageway 314 (FIG. 3) that is sized and dimensioned to receive the connector body 106 of the cable assembly 104. In an embodiment, one gasket assembly 110 may be provided for multiple openings 114 of a single receptacle housing 102. In such cases, the one gasket assembly 110 may provide an equal number of passageways as there are openings 114. In another embodiment, one gasket assembly 110 may be provided for each opening 114.

Figure 2:
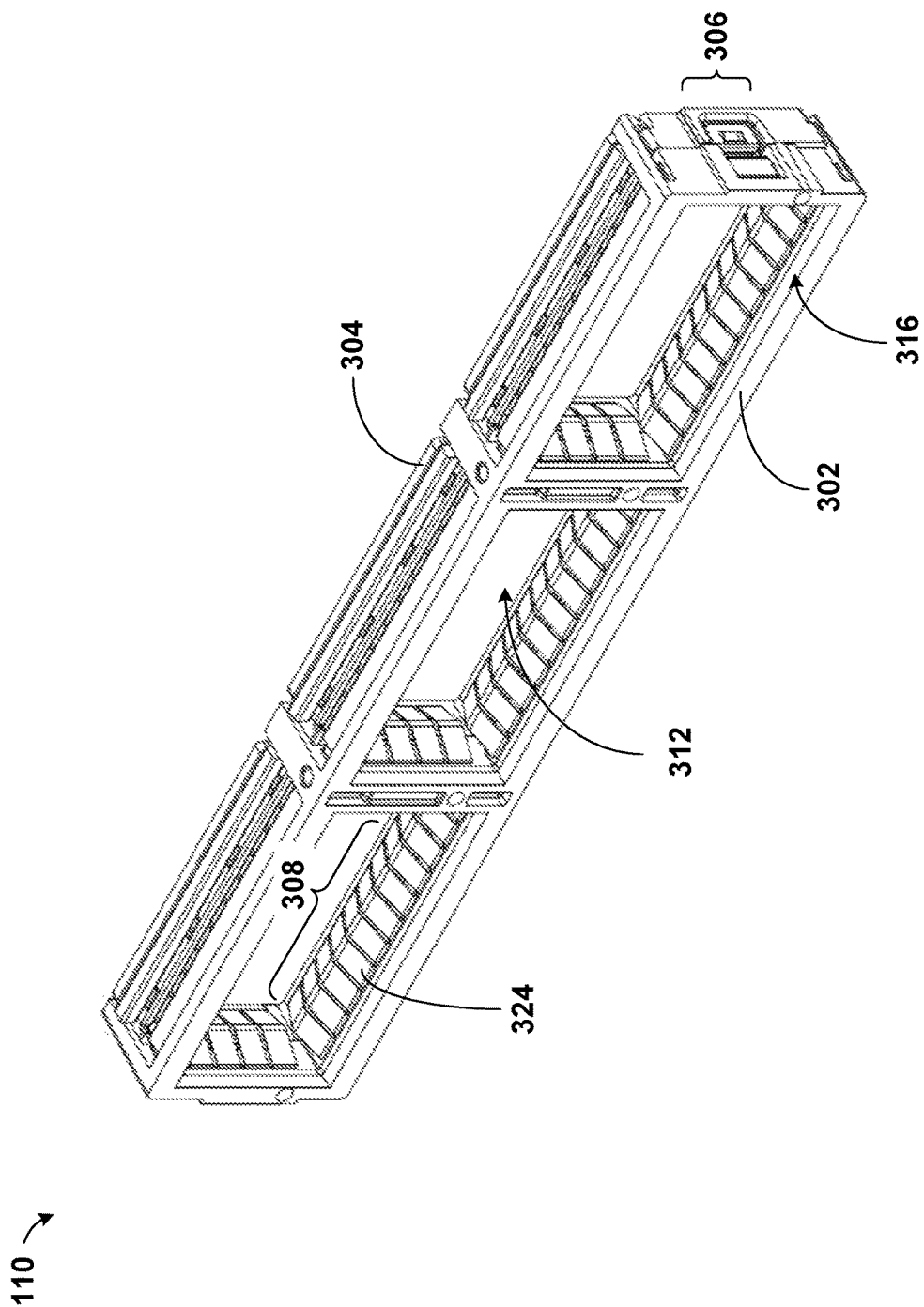
FIG. 2 is an isometric view of a gasket assembly according to an exemplary embodiment.
Figure 3:
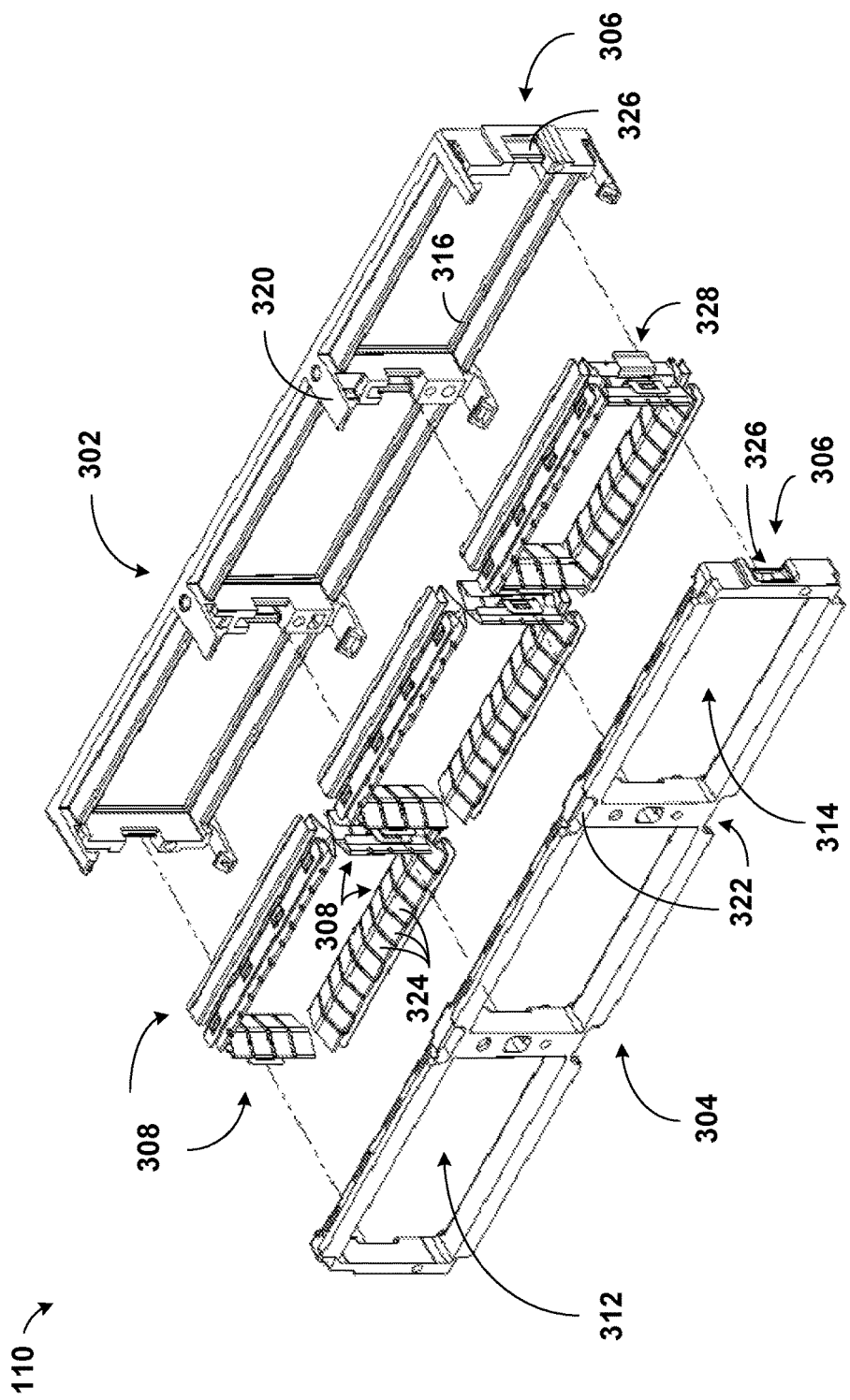
FIG. 3 is an exploded isometric view of a gasket assembly according to an exemplary embodiment.
Figure 4:
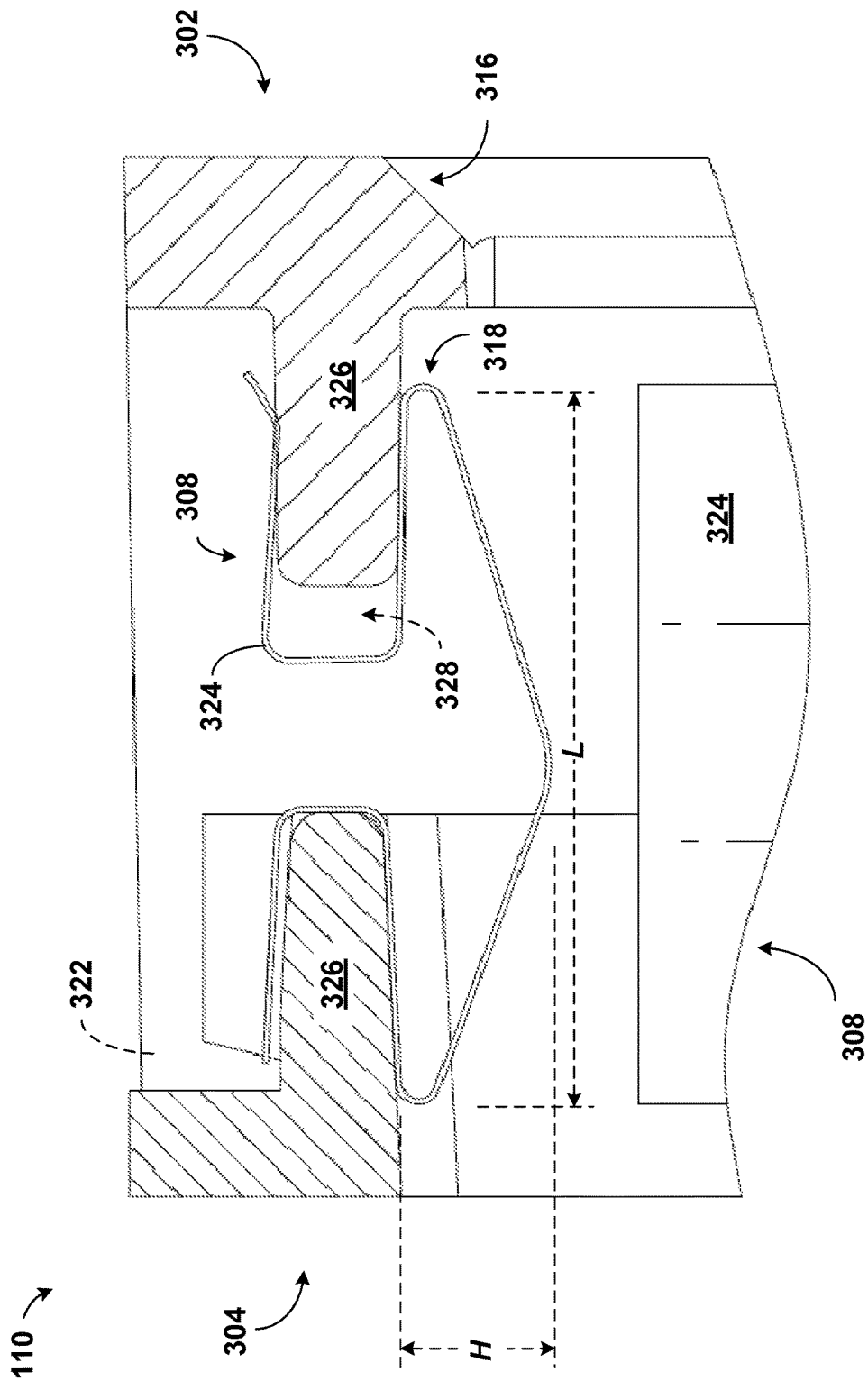
FIG. 4 is a cross section view of the gasket assembly of FIG. 2 according to an exemplary embodiment.

Referring now to FIGS. 2, 3, and 4, an isometric view of the gasket assembly 110 is shown in accordance to an embodiment of the present invention. More specifically, FIG. 2 illustrates an assembled view of the gasket assembly 110 and FIG. 3 illustrates an exploded view of the gasket assembly 110. FIG. 4 is a cross section view of the gasket assembly 110, as illustrated in FIG. 2. The gasket assembly 110 may include a frame and one or more electromagnetic gaskets 308 (hereinafter "gasket") supported by the frame. The frame may include a front half 302 and a back half 304. The one or more gaskets 308 may be secured or captured between the front half 302 and the back half 304 of the frame.

The front half 302 may be secured to the back half 304 using any known technique, for example, fasteners, glue, hooks, snaps, clips, or some combination thereof. In an embodiment, the front half 302 and the back half 304 may each have one or more corresponding tabs 306, which when engaged with one another may join and secure the front half 302 to the back half 304, and constrain the one or more gaskets 308. In an embodiment, the front half 302 may include a plurality of mating protrusions 320 positioned along a perimeter or outside edge, and the back half 304 may include a plurality of mating recesses 322 positioned along a perimeter or outside edge. As such, each of the mating recesses 322 receive one of the mating protrusions 320 to interlock the front half 302 to the back half 304. Each of the front half 302 and the back half 304 of the frame may include a window 312, which when assembled with the gaskets 308 as the gasket assembly 110, provide a passageway 314 designed to receive the connector body 106 of the cable assembly 104 (FIG. 1).

The frame, including the front half 302 and the back half 304, may be made from any suitable material known in the art. Suitable materials may be those which offer structural integrity, wear resistance as well as conductive properties. In a preferred embodiment, at least one of the front half 302 and back half 304 is made from a conductive material or has conductive properties such that electricity may be conducted from the gasket 308 to the receptacle housing 102 (FIG. 1). The conductive material of the frame will provide a path to ground between the gasket 308 and the receptacle housing 102 (FIG. 1), for any static electricity or EMI generated when the cable assembly 104 is pushed into and out of the receptacle housing 102 (FIG. 1) in direct contact with the gasket assembly 110. In an embodiment, either the front half 302, the back half 304 or both may be made from a conductive material, such as, a metal or a conductive polymer. For example, either the front half 302, the back half 304 or both may be made from a metal, such as aluminum. Alternatively, either the front half 302 or the back half 304 may be made from a plastic or a composite. In some instances, the front half 302 may be made from a metal, such as, aluminum and the back half may be made from a plastic, such as, ABS, or vice versa.

In the embodiment illustrated in the figures, the gasket assembly 110 includes three passageways 314, each designed to receive a single cable assembly 104. The passageways 314 of the gasket assembly 110 may generally correspond with the openings 114 of the receptacle housing 102. As such, the passageway 314 may generally have a complementary shape to that of the connector body 106. For example, if the front end of the connector body 106 is substantially rectangular then the corresponding passageway 314 is also substantially rectangular. It should be noted, that while the embodiment depicted in the figures includes three passageways 314, any number of passageways 314 may be included in the gasket assembly 110. The number of passageways 314 may generally match the number of cable assemblies 104 for which the receptacle housing 102 is designed to receive; however, it is conceivable for the gasket assembly 110 to have fewer passageways 314 than the number of openings 114 in the receptacle housing 102. In an embodiment, the receptacle housing 102 may include three openings 114 and the gasket assembly 110 may include only two passageways 314, in which one of the openings 114 in the receptacle housing 102 may be free of any gasket assembly 110. In another embodiment, the receptacle housing 102 may include four openings 114 and two gasket assemblies 110 each having two passageways 314.

As described herein, each passageway 314 may include four gaskets 308, one on each of the horizontal and vertical interior surfaces of the frame. As such, the gasket assembly 110 illustrated in the figures comprises a total of three passageways 314 and twelve gaskets 308. The shape of the passageway 314 may dictate the number of gaskets 108 required. In a preferred embodiment, the gaskets 108 may substantially surround the circumference or perimeter of the passageway. It should be noted that in the present case, four gaskets 108 substantially surround the perimeter of the passageway 314, even though adjacent gaskets 108 may be separated by a small space in the corners of the passageway 314. Finally, the gaskets 308 may be embodied in different shapes and configurations which may also change the number of gaskets required.

The gasket 308 is designed to occupy and thereby shield a gap that exists between the cable assembly 104 and the receptacle housing 102. Specifically, the gasket 308 is used to suppress electromagnetic interference. The gasket 308 reflects and absorbs incident radiation. The higher the attenuation of the shielding, the more effective it is at keeping in or out the undesired electromagnetic interference. The gasket 308 must be mechanically stable to ensure a continuous grounding and must be designed to facilitate repeated insertion and removal of the cable assembly 104 to and from the receptacle housing 102.

The gasket 308 may be able to occupy both the maximum and minimum distance of the gap between the connector body 106 and the frame of the gasket assembly 110 to ensure effecting EMI shielding. As such, each gasket 308 is provided with a plurality of springs 324 which provide the requisite flexibility capable of occupying the variable gaps between the connector body 106 and the frame of the gasket assembly 110. The springs 324 have a height (h) and a length (l) as illustrated in FIG. 4. The height (h) of the springs 324 may preferably be greater than a minimum distance of the gap between the connector body 106 (FIG. 1) and the frame when the cable assembly 104 (FIG. 1) is inserted into the receptacle housing 102. When inserting and removing the cable assembly 104 to and from the receptacle housing 102, the springs 324 are compressed vertically, thus reducing the height (h) of the springs 324. As a result, the length (l) of the springs 324 increases. At the maximum distance of the gap, the gasket 308 may preferably be compressed about 25% to ensure adequate contact and proper shielding; however, the gasket 308 may be compressed as much as 50% or 75% of its original, uncompressed, height (h).

As mentioned previously, the gasket 308 is secured or constrained between the front half 302 and the back half 304 of the frame. Each of the front half 302 and the back half 304 of the frame may include a mating lip 326, and the gasket 308 includes a corresponding mating channel 328. The mating lip 326 of the back half 304 and the corresponding mating channel 328 of the gasket 308 is designed with an interference fit to provide a ridged connection between the back half 304 of the frame and the gasket 308. The mating lip 326 of the front half 302 and the corresponding mating channel 328 of the gasket 308 is designed with a slip fit to allow for compression of the springs 324. The slip fit between the mating lip 326 of the front half 302 and the corresponding mating channel 328 of the gasket 308 is essential to allow the length (l) of the spring 324 to increase as it is compressed during insertion and removal of the cable assembly 104 to and from the receptacle housing 102. In addition, adequate clearance or space must be provided between an end of the mating lip 326 of the front half 302 and a bottom of the corresponding mating channel 328 of the gasket 308 to allow the length of the spring 324 to increase as it is compressed.

In an embodiment, the spring 506 may have an interference fit to the back half 304 such that the spring 324 may move minimally during the insertion and removal of the cable assembly 104 from the gasket assembly 110. Continuing in this embodiment, the spring 324 may fit to the front half 302 in such a manner that the insertion and removal of the cable assembly 104 may cause the spring 324 to compress and a portion of the spring 324 around the front half 302 may move away from the back half 304 to allow for the spring 324 movement.

In an embodiment, the gasket 308 is made of a conductive material, such as a metal. Non-limiting examples of conductive material include magnesium, aluminum, zinc, steel, brass, stainless steel, copper, beryllium copper, nickel, silver, and alloys thereof. Further, the gasket 308 may be plated to provide a protective finish to improve its function and durability. It should be noted that galvanic action between the gasket 308 and the connector body 106 (FIG. 1) should be considered when selecting the material or the plating of the gasket 308. In general, gasket 308 may be one continuous piece with individual springs 324. The individual springs 324 of the gasket 308 allow the gasket 308 to return to its original shape after it is no longer in contact with the connector body 106 (FIG. 1) of the cable assembly 104.

The gasket 308 may alternatively be referred to in the industry as an EMI shielding strip or an EMI shielding finger stock gasket. Alternatively, the gasket 308 may include metalized fabric, conductive foam, conductive elastomer or mesh.

In an embodiment, a locating ramp 316 or chamfer may be provided around the perimeter of the window 312 of the front half 302 of the frame. The locating ramp 316 on the front half 302 of the frame is critical to protect the gasket 308 and ensure that the gasket 308 is not dislodged or damaged during insertion and removal of the cable assembly 104. Specifically, the locating ramp 316 is sufficiently tall enough to protect a leading edge 318 of the gasket 308 and at a suitable angle and length to assist with fine alignment of the connector body 106 during insertion and removal of the cable assembly 104. Stated differently, the locating ramp 316 will guide and align the cable assembly 104 when it is inserted into the housing.

Figure 5:
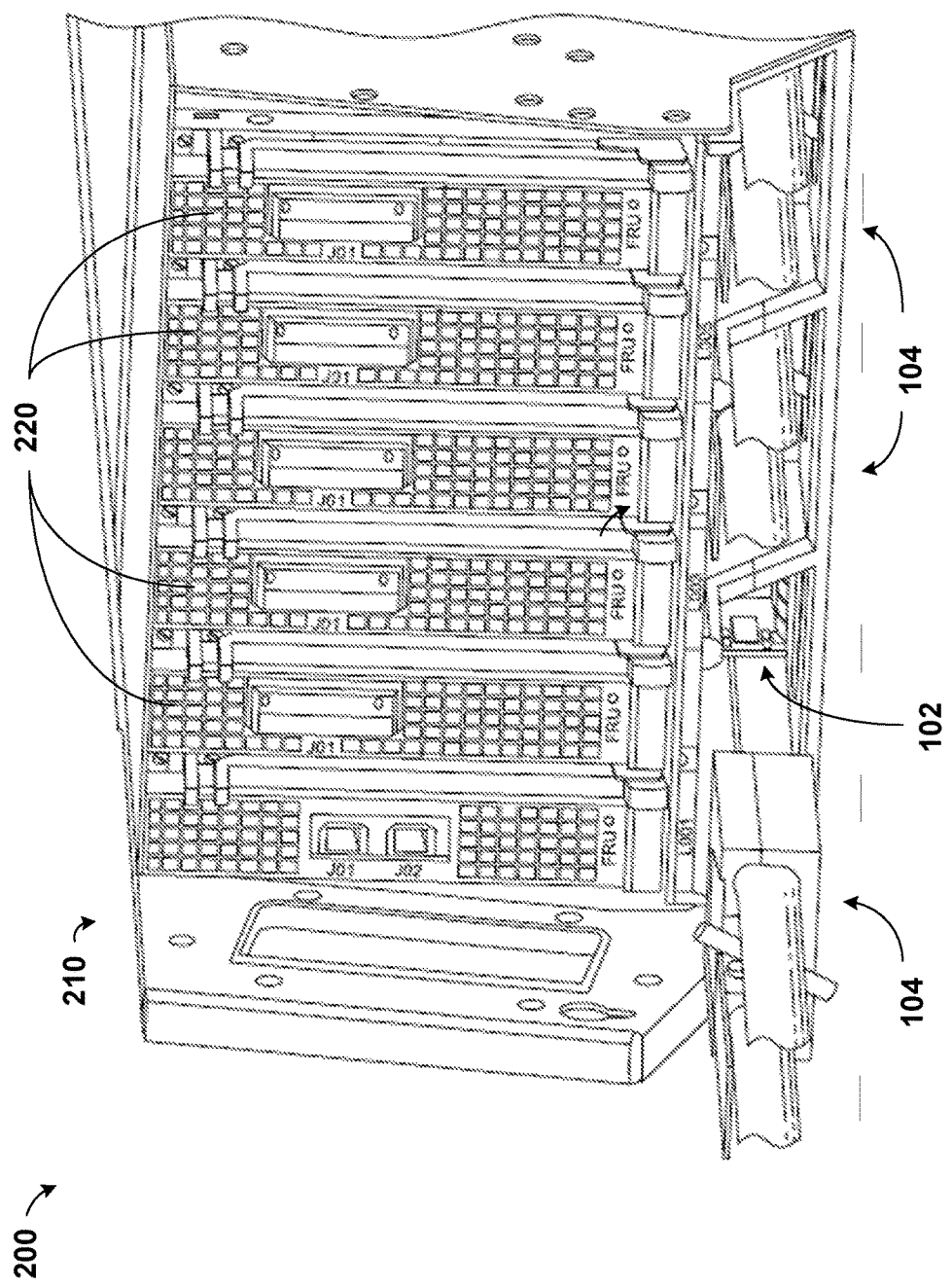
FIG. 5 is an isometric view of a second assembly according to an exemplary embodiment.

Referring to FIG. 5, an isometric view of a second assembly 200 is shown in accordance to an embodiment of the present invention. The second assembly 200 may include a chassis 210, a card 220, the receptacle housing 102 and one or more cable assemblies 104. It should be noted that, while the embodiment depicted in the figures includes six cards 220, any number of the cards 220 may be part of the second assembly 200. The second assembly 200 is an example of an arrangement of the receptacle housing 102 and the cable assembly 104 as implemented in a server or mainframe computer.

With continued reference to FIGS. 1-5, the gasket 308 provides EMI shielding, and may also securely hold the cable assembly 104 in place after the insertion of the cable assembly 104 into the receptacle housing 102 to create the requisite cable connection(s). In an embodiment, the cable assembly 104 is inserted into the receptacle housing 102. At the time of the insertion, the springs 324 of the gasket 308 of the frame will compress, allowing a secure fit between the connector body 106 and the receptacle housing 102, thus minimizing the gap between the cable assembly 104 and the receptacle housing 102. The springs 324 of the gasket 308 provides a ground to the receptacle housing 102, minimize the electronic emission of the cable assembly 104 and minimizes the introduction of external electromagnetic disturbances into the cable assembly 104. In this embodiment, the wire bundles 108 may have cable connections to the server or to the mainframe which the receptacle housing 102 is a part of.

In an embodiment, the gasket 308 and the frame may fit together such that the gasket 308 remains in place during the insertion and removal of the cable assembly 104. The springs 324 of the gasket 308 may compress during insertion of the cable assembly 104 and return to their original shape after the removal of the cable assembly 104. A gasket assembly 110 mounted within the housing 102 may preferably be durable and robust so as to prevent the gasket 308 from being damaged. This is especially important because damaged portions of the gasket 308 can potentially break free and become lodge further within the opening 114 potentially causing a short circuit at the receptacle. Therefore, special care was taken in the design of the gasket assembly 110, especially in the design of the frame. In particular, this was a challenge to design the gasket assembly 110 to withstand multiple insertions and removals of the cable assembly 104.

Housing electromagnetic gaskets 308 for a cable connection within the receptacle housing 102 is a unique feature of this invention and has several advantages over the traditional location of housing electromagnetic gaskets 308 externally on an exterior perimeter of the connector body 106 of a cable assembly 104. The advantages of housing the gasket assembly 110 within the receptacle housing 102 include the physical protection of the gasket assembly 110, reduced handling of the gasket assembly 110, physical protection of an operator due to recessed gaskets 308, and reduced system maintenance costs.

Housing the gasket assembly 110 within the receptacle housing 102 helps to protect the gasket assembly 110 from external exposure and handling during cable assembly 104 insertion and removal from the receptacle housing 102. In this embodiment, an operator who is responsible for the insertion and the removal of the cable assembly 104 into and out of the receptacle housing 102 may not have direct contact with the gasket assembly 110 and the operator may be protected from any sharp points of the gasket. Continuing in this embodiment, the gasket assembly 110 is also protected from the operator during the insertion and removal of the cable assembly 104 from the receptacle housing 102, which may result in a reduction of cable assembly 104 damage. The reduction of cable assembly 104 damage will help to reduce system maintenance costs. In this embodiment, there is also an improved cable esthetic due to the removal of the gaskets 308 from the connector boy 106 of the cable assembly 104. It may be noted that not all advantages of the present invention are include above.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A housing structure comprising:
    a receptacle recessed within an opening on a front side of the housing, the receptacle is rigidly attached to the housing; and
    a gasket assembly recessed within the opening and located between the front side of the housing and the receptacle,
    wherein the gasket assembly is directly secured to the housing and comprises a passageway defined by an electromagnetic gasket constrained between a front half and a back half of a frame.

2. The housing structure of claim 1, wherein the gasket assembly comprises an electromagnetic gasket constrained between the front half of the frame and the back half of the frame, wherein the frame holds the electromagnetic gasket firmly while allowing movement for flexing, and the back half has an interference fit on a ledge of the back half, and the front half has a slip fit on a ledge of the front half, allowing movement for flexing.

3. The housing structure of claim 1, wherein the gasket assembly comprises a window and the electromagnetic gasket lines an interior perimeter of the window.

4. The housing structure of claim 1, wherein the housing structure comprises more than one opening and the gasket assembly comprises a window corresponding to at least one of the openings.

5. The housing structure of claim 1, wherein the housing comprises a divider between the windows for gross alignment of the cable assembly.

6. The housing structure of claim 1, wherein at least one of the front half and the back half comprises a conductive material.

7. A structure comprising:
a housing comprising:
a receptacle recessed within an opening on a front side of the housing, the receptacle is rigidly attached to the housing; and
a gasket assembly recessed within the opening and located between the front of the housing and the receptacle, the gasket assembly is directly secured to the housing and comprises a passageway defined by an electromagnetic gasket constrained between a front half and a back half of a frame,
wherein the receptacle receives a cable assembly to form a cable connection between the cable assembly and the housing, and the passageway is sized and dimensioned to receive a connector body of a cable assembly such that the connector body is in direct contact with the electromagnetic gasket.

8. The structure of claim 7, wherein the frame of the gasket assembly securely holds the electromagnetic gasket firmly within the housing while allowing a spring portion of the electromagnetic gasket to flex or deflect in response to direct contact with the connector body.

9. The structure of claim 7, wherein the gasket assembly has a window and the electromagnetic gasket lines an interior perimeter of the window.

10. The structure of claim 7, wherein the housing has more than one opening and the gasket assembly has a window corresponding to at least one of the openings.

11. The structure of claim 7, wherein the housing has a divider between windows for gross alignment of the cable assembly.

12. The structure of claim 7, wherein the gasket assembly comprises:
a front half, comprising a first tab; and
a back half, comprising a second tab, wherein the first tab and the second tab align and interlock, and at least one of the front half and the back half comprise a conductive material.

* * * * *